Figure 2:
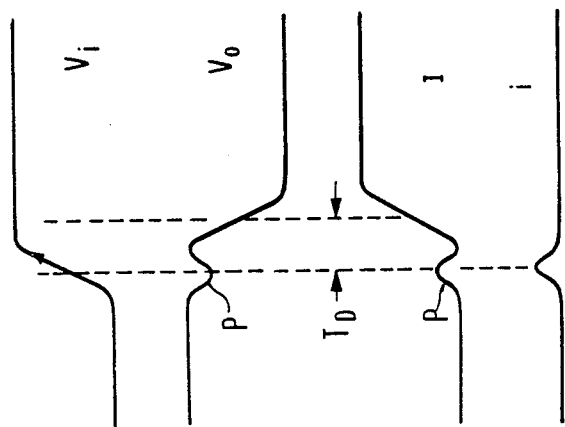

United States Patent [19]

Naimpally et al.

[11] Patent Number: 4,575,650
[45] Date of Patent: Mar. 11, 1986

[54] SIGNAL TRANSLATING CIRCUIT WITH COMPENSATED TRANSIENT RESPONSE

[75] Inventors: Saiprasad V. Naimpally; Thomas D. Gurley, both of Indianapolis, Ind.

[73] Assignee: RCA Corporation, Princeton, N.J.

[21] Appl. No.: 518,461

[22] Filed: Jul. 29, 1983

[51] Int. Cl.⁴ .......................... A03B 1/00; H03K 5/00
[52] U.S. Cl. .................................... 307/520; 328/167; 330/294
[58] Field of Search ................ 307/520; 328/167, 165; 330/144, 145, 294, 303; 333/167, 174, 175, 176

[56] References Cited

U.S. PATENT DOCUMENTS 4,319,359  3/1982  Wolf ..................................... 328/111
4,489,286  12/1984  Naimpally ........................... 307/520

Primary Examiner—Stanley D. Miller
Assistant Examiner—Timothy P. Callahan
Attorney, Agent, or Firm—P. J. Rasmussen; P. M. Emanuel; R. H. Kurdyla

[57] ABSTRACT

A signal voltage from a signal processing path is coupled via an interfacing terminal to an input port of a filter, the output port of which is connected to the base input of a current source transistor to supply thereto a signal voltage which exhibits the filter transfer function. The collector output of the current source transistor is also coupled to the interfacing terminal and conducts a current exhibiting the filter transfer function to the signal path via the interfacing terminal. The base input of the current source transistor is driven with filter output sigals via a low output impedance voltage source (e.g., an emitter follower stage). The impedance presented to the base of the transistor is primarily determined by the low output impedance of the voltage source.

10 Claims, 2 Drawing Figures

SIGNAL TRANSLATING CIRCUIT WITH COMPENSATED TRANSIENT RESPONSE

This invention concerns an electrical signal translating circuit with compensation for distortion of signal amplitude transitions produced by parasitic circuit elements.

A copending U.S. patent application Ser. No. 470,618 of W. E. Sepp, filed Feb. 28, 1983 and titled "High Order Electrical Signal Filters" discloses a frequency selective signal translating arrangement wherein a signal processing path is coupled via an interfacing terminal to an input port of a high order filter, the output port of which is connected to the base input of a current source transistor to supply thereto a signal voltage which exhibits the filter transfer function. The collector output of the current source transistor is also coupled to the interfacing terminal and conducts a current exhibiting the filter transfer function to the signal processing path via the collector current path of the transistor and the interfacing terminal.

Such filter arrangement offers the significant advantage of permitting a high order, three terminal filter to be coupled to the signal path via only a single interface terminal. However, it has been observed that the collector-to-base parasitic capacitance of the current source transistor can lead to distortion of the signal flowing in the signal processing path particularly during amplitude transitions thereof. Such distortion is significantly reduced by an arrangement in accordance with the present invention.

In accordance with the principles of the present invention there is disclosed herein a circuit including an amplifier device with input and output terminals exhibiting a parasitic capacitance therebetween. Input and output ports of a signal translating network are respectively coupled to the output and input terminals of the amplifier device, and a source of signal voltage to be filtered is coupled to both the input port of the translating network and to the output terminal of the amplifier device. The input terminal of the amplifier device is driven with output signals from the translating network conveyed via a low output impedance signal voltage source. The impedance presented to the input terminal of the amplifier device is primarily determined by the low output impedance of the voltage source.

In accordance with a feature of the invention, the low impedance signal voltage source comprises an emitter follower transistor.

In accordance with a further feature of the invention, the translating network comprises a high order filter of the three-terminal, two-port type.

IN THE DRAWING

Figure 1:
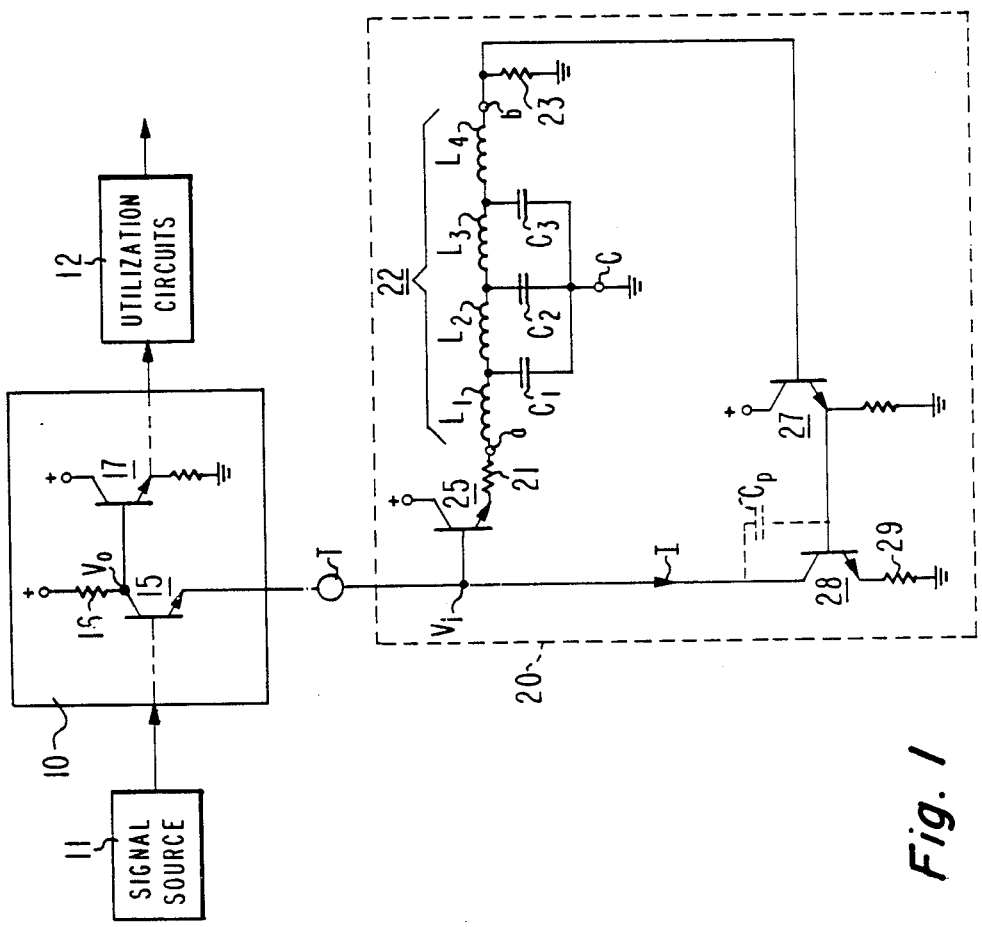

FIG. 1 shows a signal processing circuit including a translating circuit according to the present invention; and FIG. 2 depicts signal waveforms helpful in understanding the operation of the translating circuit in FIG. 1.

In FIG. 1, a signal processing network 10 responds to signals from a source 11 for providing translated output signals to utilization circuits 12. A signal path within network 10 includes an amplifier transistor 15 with an associated collector output load resistor 16, coupled to an output emitter follower transistor 17. A signal voltage related to the signal voltage to be processed in the signal path appears at the low impedance emitter output of transistor 15 and at an interface terminal T to which a signal translating circuit 20 for imparting a filter characteristic to the signal path is connected.

Translating circuit 20 comprises a seventh order low pass filter 22 including inductors $L_1$–$L_4$ and capacitors $C_1$–$C_3$. Resistors 21 and 23 serves as terminating impedances for filter 22. The configuration of filter 22 is that of a filter having three terminals (a,b,c), an input port corresponding to terminal "a" referenced to common terminal "c", and an output port corresponding to terminal "b" also referenced to common terminal "c". An input emitter follower transistor 25 conveys an input signal voltage $V_i$ to the input port of filter 22. Input signal voltage $V_i$ substantially equals the signal voltage at the emitter of transistor 15 in the signal path. A signal voltage exhibiting the transfer function (i.e., amplitude-versus-frequency response) of filter 22 is developed across resistor 23 and is coupled via an emitter follower transistor 27 to the base input of a current source transistor 28. The output collector-emitter current path of transistor 28 is coupled to the signal path in signal processor 10 via interface terminal T and the emitter of transistor 15.

Transistor 28 serves as a voltage-to-current converting device which develops an output collector current "I" which exhibits the transfer function of filter 22, in response to the base signal voltage applied to transistor 28 from the output of filter 22. Specifically, the collector current of transistor 28 corresponds to the product of input signal voltage $V_i$ and the transfer function of filter 22. The collector current of transistor 28 determines the emitter and collector currents of amplifier transistor 15, whereby an output signal voltage $V_o$ developed across load resistor 16 is affected by the transfer function of filter 22.

The signal gain of the amplifier comprising transistor 15 is determined by the ratio of the value of collector load impedance 16 to the value of the impedance presented to the emitter of transistor 15 by network 20. In this regard it is noted that network 20 synthesizes, at terminal T, an impedance related to the transfer function of filter 22. The impedance of network 20 decreases for signal frequencies within the passband of filter 22. Thus signal frequencies within the passband of filter 22 receive greater amplification by transistor 15, compared to out of band signal frequencies which cause network 20 to exhibit a relatively greater impedance at the emitter of transistor 15. The arrangement of network 20 together with network 10, with the exception of emitter follower transistor 27, corresponds to an arrangement disclosed in the aforementioned patent application of W. E. Sepp, incorporated herein by reference.

Filter 22 in network 20 can comprise a passive high order filter as illustrated, or an active high order filter. In addition, signal translating stages, e.g., including amplifiers, gain control and level shifting circuits, can be coupled between the output of filter 22 and the input of follower transistor 27 in accordance with the requirements of a particular system.

Voltage-to-current translating transistor 28 exhibits a parasitic collector-base capacitance $C_p$ which can introduce a distortion component to the output current I of transistor 28, and thereby to output voltage $V_o$ in the signal path, particularly during amplitude transitions of input signal voltage $V_i$ In this regard reference is made to the waveforms in FIG. 2.

FIG. 2 illustrates input signal voltage $V_i$ with a rising amplitude transition, an inverted and delayed version of which appears as output signal voltage $V_o$ at the signal inverting collector output of amplifier transistor 15 in response to current I. Signal current I and signal voltage $V_o$ exhibit similar delays relative to input signal voltage $V_i$ due to a time delay $T_D$ associated with filter 22. An unwanted signal perturbation P, corresponding to a "pre-ring" signal component, appears in signals I and $V_o$ due to the effect of the parasitic collector-base capacitance of transistor 28.

Perturbation component P is caused by differentiation of signal voltage $V_i$ which appears at the collector of transistor 28, by the effective value of the parasitic collector-base capacitance of transistor 28, hereinafter referred to as effective capacitance $C_E$, during the amplitude transition interval of signal voltage $V_i$. Effective parasitic capacitance $C_E$ corresponds to a multiplied version of capacitance $C_p$ as will be discussed. The perturbation component is attributable to a current i conducted by the effective parasitic capacitance, where $$i = C_E \frac{dV_i}{dt}$$

and is illustrated in FIG. 2. Thus the magnitude of the perturbation component is related to the value of effective capacitance $C_E$. More specifically, the perturbation component is developed as a result of the $dV_i/dt$ component in current I caused by the effective capacitance presented to signal voltage $V_i$ at the collector of transistor 28.

In the latter regard it is noted that the input admittance presented to signal voltage $V_i$ at the collector of transistor 28 is capacitive as a function of the value of effective capacitance $C_E$, and is also a function of the current gain (Beta) of transistor 28 and the impedance presented to the base input of transistor 28. The value of effective capacitance $C_E$ as presented to signal $V_i$ at the collector of transistor 28 corresponds to a multiplied capacitance version of collector-base capacitance $C_p$, which produces a perturbation component with a significantly larger amplitude than that due to the value of capacitance $C_p$ by itself.

Such capacitance multiplication and resulting larger amplitude perturbation component are substantially precluded by the manner in which filtered signal voltages are applied to the base input of transistor 28 via the low impedance emitter output of follower transistor 27. The emitter impedance of voltage follower transistor 27 is very low, approximately 20 ohms. The impedance presented to the base of transistor 28 is primarily determined by such low emitter output impedance of transistor 27. When, for example, the parasitic capacitance between the collector and base of transistor 28 has a value of 4 picofarads, transistor 28 has a Beta of 300, and emitter resistor 29 of transistor 28 has a value of 1 kilohm, the value of effective capacitance $C_E$ is substantially equal to the parasitic collector-base capacitance by itself (4 pf), whereby any perturbation component in the output signal is not subject to being increased in amplitude due to an effective increase in the value of collector-base capacitance $C_p$. In contrast, the value of capacitance $C_p$ is multiplied to an effective value of approximately 16 picofarads when, for example, the impedance presented to the base of transistor 28 is on the order of 3 kilohms such as may be determined by the impedance of filter 22 and circuits associated with the output of filter 22. The significant increase in the amplitude of the perturbation component produced in the latter case is avoided with the disclosed arrangement including follower transistor 27. It has been observed that the perturbation component P in output signal $V_o$ exhibits an amplitude of less than 5% of the amplitude transition of signal $V_o$ with the arrangement of FIG. 1. On the other hand, a perturbation component with a significantly greater amplitude in excess of 15% of the output signal amplitude transition was observed when the base input of transistor 28 was driven with a signal source of higher impedance, e.g., on the order of a few kilohms.

The signal delay ($T_D$) exhibited by filter 22 magnifies the effect of the perturbation component by causing the perturbation component to appear as a "pre-ring" in output signal $V_o$. If the delay between signals $V_i$ and I was negligible, the perturbation component would occur substantially in the middle of the amplitude transition of output signal $V_o$. In either case, the perturbation component, and particularly a perturbation component of enhanced amplitude, undesirably distorts the output signal amplitude transition. This result is particularly undesirable in a video signal processing and display system such as a television receiver since it leads to impairment of the edge definition of a displayed video image, resulting in a displayed picture of reduced quality.

What is claimed is:

1. Signal translating apparatus comprising:
   a signal path including a source of signal voltage to be translated;
   signal translating means having an input and an output;
   current amplifier means having input and output terminals exhibiting a parasitic capacitance therebetween;
   first means for coupling said signal source to said input of said translating means and to said output terminal of said current amplifier means; and
   second means comprising a low output impedance voltage source, for coupling translated signals from said output of said translating means to said input terminal of said current amplifier means for causing said current amplifier to conduct an output current representative of translated signals to said signal source; wherein
   the impedance presented to said input terminal of said current amplifier means is primarily determined by said low output impedance of said voltage source.

2. Apparatus according to claim 1, wherein
   said current amplifier means comprises a transistor having a base input electrode corresponding to said input terminal, a collector output electrode corresponding to said output terminal, and an emitter electrode; and
   said low impedance voltage source corresponds to an emitter follower transistor having a base input electrode coupled to said output of said translating means, and an emitter output electrode coupled to said base input of said current amplifier transistor.

3. Apparatus according to claim 1, wherein
   said signal translating means corresponds to an electrical signal filter.

4. Apparatus according to claim 3, wherein said filter corresponds to a high order filter of the three-terminal, two-port type.

5. Apparatus according to claim 1, wherein
said source of signal voltage in said signal path comprises a signal amplifier with an input first terminal, a low impedance second terminal at which said signal voltage to be translated appears, and an output third terminal;
an output load impedance is coupled to said output third terminal; and
a single interface terminal couples said source of signal voltage in said signal path to said translating means and said output terminal of said current amplifier means.

6. Apparatus according to claim 5, wherein
said single interface terminal conducts output current from said current amplifier means to said signal amplifier in said signal path.

7. Apparatus according to claim 6, wherein
said signal amplifier in said signal path comprises a transistor with a base input electrode, a low impedance emitter electrode, and a collector output electrode; and
said single interface terminal couples said low impedance emitter electrode of said amplifier transistor in said signal path to said translating means and to said output terminal of said current amplifier means.

8. Apparatus according to claim 7, wherein said translating means comprises an electrical signal filter.

9. Apparatus according to claim 1, wherein
said source of signal corresponds to a source of video signal.

10. An electrical signal processing circuit comprising:
a source of signals;
first and second transistors each having a base input electrode, a collector output electrode and an emitter electrode, said collector and emitter electrodes defining main current paths for said transistors;
means for coupling said signal source to said base electrode of said first transistor;
an output impedance coupled to said collector electrode of said first transistor;
means for coupling said main current paths of said first and second transistors in series;
an electrical signal filter with an input coupled in common to said emitter of said first transistor and said collector of said second transistor, and an output; and
a third transistor with a base input coupled to said filter output, and an emitter output for providing filter output signals to said base input of said second transistor; wherein
the impedance presented to said base input of said second transistor is primarily determined by the emitter output impedance of said third transistor.

* * * * *